United States Patent [19]

Suzuki et al.

[11] Patent Number: 4,996,671
[45] Date of Patent: Feb. 26, 1991

[54] SEMICONDUCTOR MEMORY DEVICE

[75] Inventors: Hiroyuki Suzuki; Shigeo Araki, both of Kanagawa, Japan

[73] Assignee: Sony Corporation, Tokyo, Japan

[21] Appl. No.: 481,057

[22] Filed: Feb. 16, 1990

[30] Foreign Application Priority Data

Feb. 18, 1989 [JP] Japan .................................. 64-39039
Feb. 21, 1989 [JP] Japan .................................. 64-39410

[51] Int. Cl.[5] ............................................. G11C 13/00
[52] U.S. Cl. ..................................... 365/203; 365/227
[58] Field of Search .............. 361/189.01, 203, 230.01, 361/227

[56] References Cited

U.S. PATENT DOCUMENTS 4,608,667 8/1986 Barry .............................. 365/189.02

Primary Examiner—Terrell W. Fears
Attorney, Agent, or Firm—Hill, Van Santen, Steadman & Simpson

[57] ABSTRACT

A semiconductor memory device of the present invention includes bit lines and common data lines for data writing or readout into or from plural memory cells. On these bit lines and common data lines, equalizing or precharging circuits are provided and operate during address transition. During transition from writing to readout, such transition is detected to actuate the equalizing or precharging circuits more promptly than usual to shorten the write recovery time to realize a high speed operation. The output circuit of the semiconductor memory device of the present invention is provided with a precharging circuit for sensing and precharging the level on the output terminal to an intermediate level. The output circuit of this construction allows to reduce the power consumption and to assure a high speed outputting operation.

16 Claims, 7 Drawing Sheets

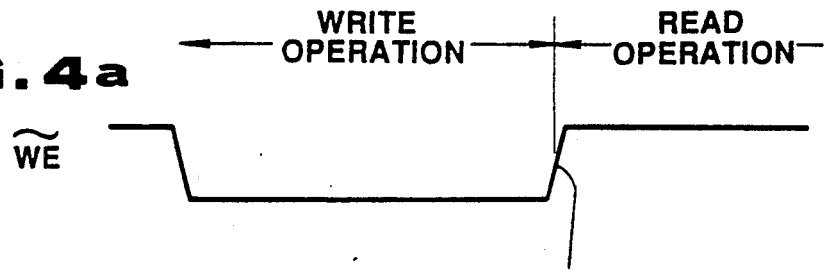
FIG. 4a
$\widetilde{WE}$
FIG. 4b
φ EQW
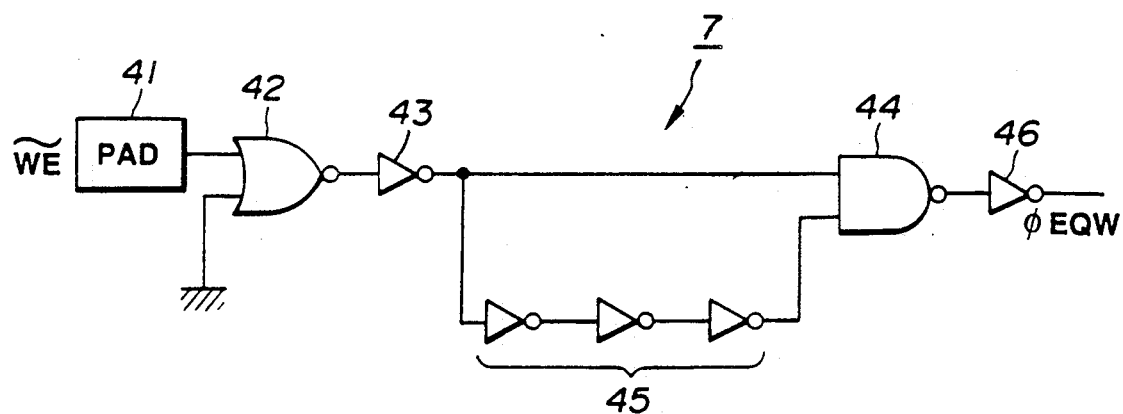
FIG. 5

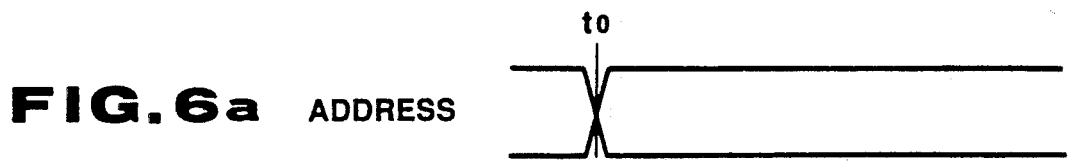
FIG. 6a ADDRESS
FIG. 6b WORD LINES
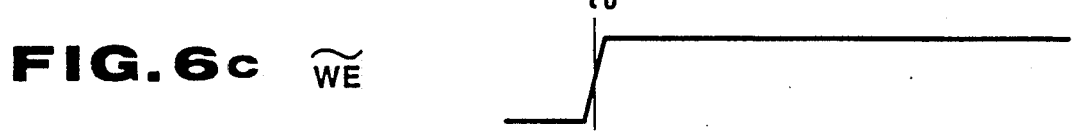
FIG. 6c $\widetilde{WE}$
FIG. 6d $\phi$ EQW
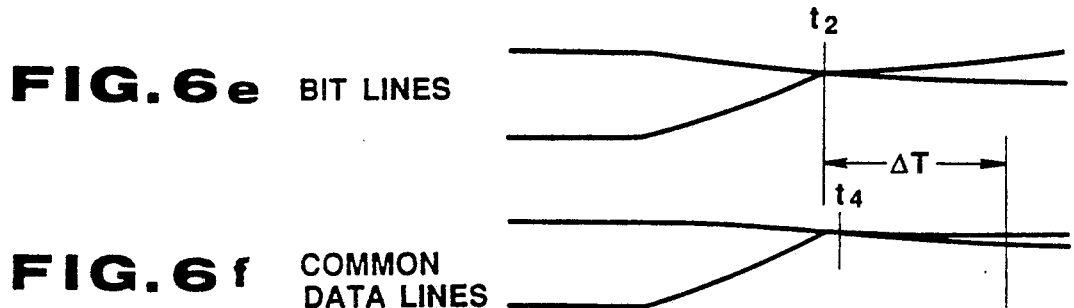
FIG. 6e BIT LINES
FIG. 6f COMMON DATA LINES
FIG. 6g $\phi$ EQ
FIG. 6h BIT LINES
FIG. 6i COMMON DATA LINES

SEMICONDUCTOR MEMORY DEVICE

BACKGROUND OF THE INVENTION (1) Field of the Invention

This invention relates to a semiconductor memory, and more particularly to a semiconductor memory that can be suitably adapted to a static random access memory, referred to hereinafter as static RAM or SRAM, which has a large capacity and operates at high speeds.

(2) Description of the Prior Art

In a static RAM in general, a signal potential difference is produced across a pair of bit lines or a pair of common data lines in order to effect data readout or data writing. For high speed readout or writing operations, it is necessary to change the logical level quickly. Thus there is known a technique of shorting a pair of bit lines or a pair of common data lines, across which the signal potential difference is produced, for equalizing the logical level for the next data. On the other hand, when the bit lines having the logical level opposite to that of the cell are connected to the memory cell at the time of row selection, the data on the memory cell may be occasionally reversed. Thus there is also known a precharging technique of transiently raising the bit line voltage towards the source voltage prior to row selection (word line selection) of the bit lines.

Such equalizing o precharging is usually performed at the time of the writing or reading and before row selection. The timing is produced by an address transition detection circuit (ATD) adapted for generating pulses by changes in the addresses. For example, according to the Japan Laid Open Patent Publication NO. 57-74884 or the U.S. Pat. No. 4355377, pulses are generated in the address transition detection circuit by the changes in the addresses so as to be transmitted to a clock generator. The signals for controlling the equalizing or precharging are output from the clock generator to actuate the equalizing or precharging circuits provided on the bit line pairs to shorten the access time.

However, during transition from the write operation to the readout operation in general, the bit lines or the common data lines are substantially in what is called fully swung state. For this reason, sufficient time is necessitated for equalizing or precharging, such that, when the speed is to be increased, it becomes difficult to terminate the equalizing or precharging operation before word line selection.

On the other hand, when pulses are produced more promptly from the address transition detection circuit, the equalizing or precharging operation can be terminated more promptly. However, as shown diagrammatically in FIG. 1, the address transition detection circuit 101 functions to collect the data at address inputs 100*a* to 100*g*, detect the address data transition and to transmit pulses to a clock generator 102. The address inputs 100*a* to 100*g* are widely distributed on a chip 103, so that it is extremely difficult to detect data transition of each address at a higher speed. The more the number of addresses, the larger is the scale of the address transition detection circuit 101 and the longer is the time involved until pulse generation.

The above mentioned problem is raised during transition from writing until readout of the SRAM data. The following problem is additionally raised when the speed is to be increased in the output circuit of the SRAM.

That is, the output signal from the output circuit (output buffer) usually has a binary logical level and the output circuit output data according to the two levels, that is, the high level of the source voltage and the low level of the ground voltage. An example of such output circuit is described in the Japan Laid Open Patent Publication NO. 62-214583 in which a precharging circuit is formed at the output terminal of the final output stage to enable high speed swinging. This precharging circuit includes each one MOS transistor between the output terminal and the source voltage and between the output terminal and the ground voltage. These MOS transistors are turned on by the equalizing signal from the address buffer to effect the precharging operation. By such precharging operation, the output level is between the two logical levels, so that high speed swinging is realized at the time of the ensuring swinging to the high or low level.

However, the output circuit having the precharging circuit suffers from the through-current flowing in the MOS transistor.

That is, during precharging, both the MOS transistor between the output terminal and the source voltage line and the MOS transistor between the output terminal and the ground voltage line are turned on to permit the through-current to flow from the source voltage line towards the ground voltage line to increase power consumption.

SUMMARY OF THE INVENTION

It is a primary object of the present invention to provide a semiconductor memory device for performing a high-speed equalizing or pre-charging operation at the time of transition from the writing operation to the read-out operation.

It is another object of the present invention to provide a semiconductor device provided with an output circuit capable of realizing a high speed readout operation under suppression of the through-current.

For accomplishing the above primary object, the semiconductor memory device of the present invention includes a pulse generator adapted for producing a pulse on detection of the transition from writing to readout, wherein the bit lines or the common data lines are equalized or precharged by the produced pulse. A write enable or WE signal may be used as the signal for detecting the transition from writing to readout.

According to an embodiment of the present invention, the pulse signal from the pulse generator is transmitted to a bit line equalizing control circuit, a bit line precharging control circuit, a common data line equalizing control circuit or to a common data line precharging control circuit. Control signals for the equalizing circuit or the precharging circuit are transmitted from each of these control circuits. For operations other than those during transition from writing to readout, each control circuit receives not only the pulse signal from the pulse generator but also the signal from the address transition detection circuit.

For accomplishing the second object, the semiconductor memory device includes level detection means for detecting the level of the output signal having first and second levels, and a precharging circuit respective to the signal from the level detection signal to set the output level to a third level between the first and the second levels. The first level is the high or low logical level, while the second level is the logical level which is the reverse of the first level. The third level can be matched to the output decision level.

More specifically, the level detection means of the output circuit may be adapted to detect only the first level or the second level to generate a signal, or may also be adapted to detect both the first and the second levels to generate signals corresponding to these levels. The level detection means may be actuated by the equalizing signals, and constituted by a variety of logical circuits operating under voltage feedback from the output. With the arrangement for detecting only the first level or the second level, a switch may be provided between the output and the potential which is the reverse of the opposite logical level potential. In an arrangement for detecting both the first and the second level, switches may be provided between both of these levels and the output. These switches may be constituted each by MOS transistors.

The third level, which is the output deciding level, may be matched as an example, to the TTL threshold value. This third level may be set with a small margin from the TTL threshold level to provide for a high speed operation even with the same output level before and after the precharging operation. For precharging the low level, a level slightly lower than the threshold value of the TTL circuit proves to be the third level, whereas, for precharging the high level, a level slightly higher than the threshold value of the TTL circuit proves to be the third level. The third level may also be an intermediate level, such as $\frac{1}{2}$ Vcc (source voltage), without being limited to the TTL threshold level.

BRIEF DESCRIPTION OF THE DRAWINGS

FIG. 4 is a timing chart showing the operation of a $\phi$EQW generating circuit in the device of FIG. 2.

FIG. 5 is a circuit diagram showing an example of the $\phi$EQW generating circuit.

FIG. 6 is a timing chart for illustrating the operation of the semiconductor memory device of FIG. 2.

DESCRIPTION OF PREFERRED EMBODIMENT

Figure 1:
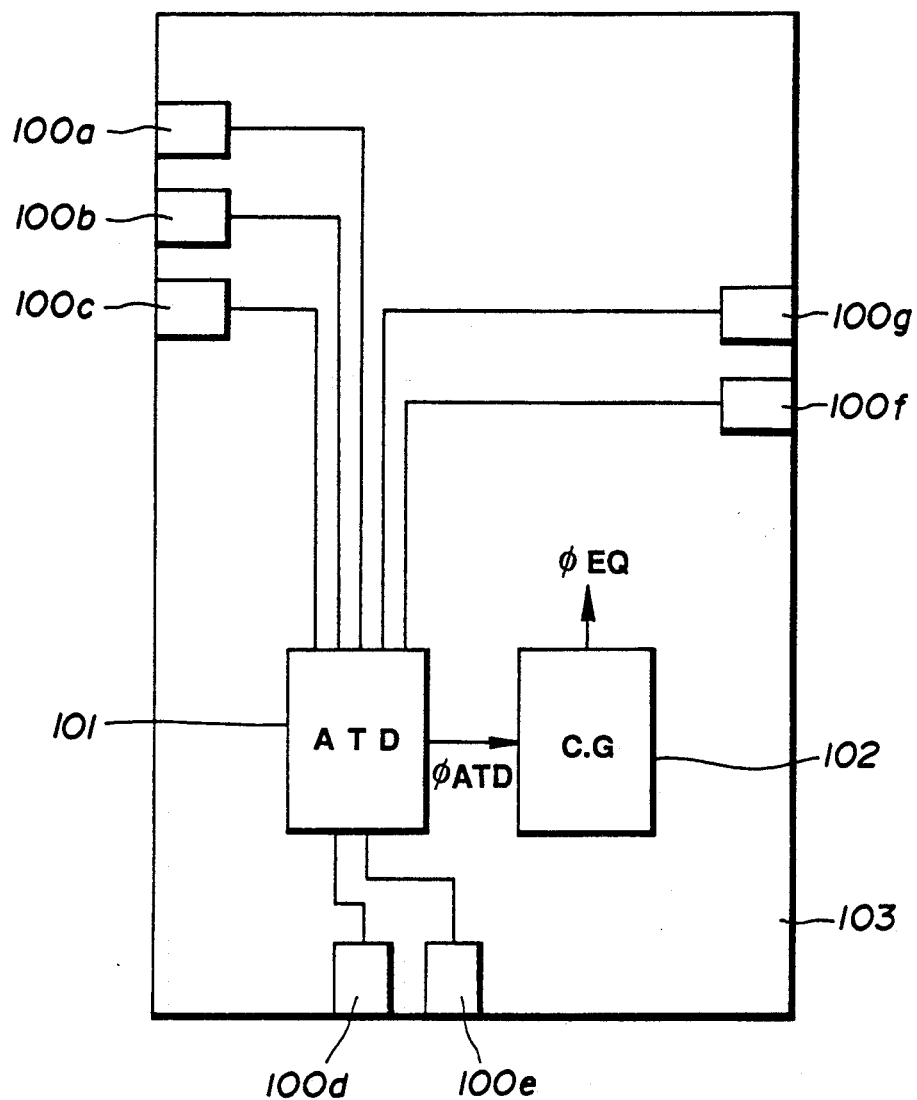
FIG. 1 is a diagrammatic view showing a chip of a conventional semiconductor memory device.

By referring to the drawings, a preferred illustrative embodiment of the present invention will be explained in detail.

Figure 2:
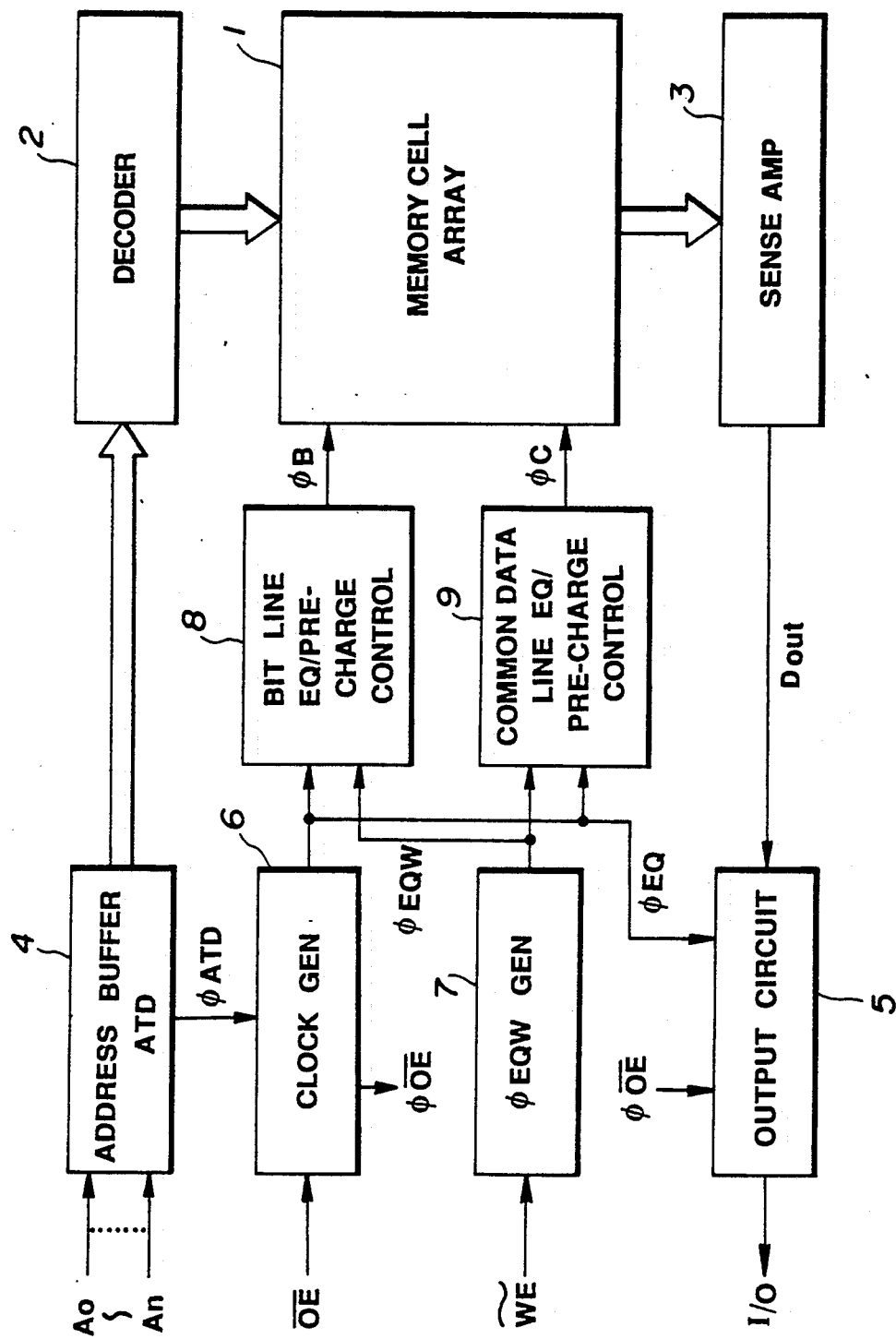
FIG. 2 is a block diagram showing an arrangement of a typical semiconductor memory device of the present invention.

Reference is first had to FIG. 2 for briefly illustrating an overall schematic construction of an SRAM of a CMOS structure of the illustrative embodiment. The circuitry of the SRAM is constructed by MOS transistors formed on the major surface of a semiconductor substrate and includes an address buffer-address transition detection circuit (ATD) 4 to which address signals $A_O$ to $A_n$ are input and from which address data are transmitted to a decoder 2. Memory cell selection signals are transmitted from the decoder 2 to a memory cell array 1 where a desired memory cell is selected and corresponding data are read out. The data from the memory cell array 1 are amplified by a sense amplifier 3 from which data output signals $D_{out}$ are transmitted to an output circuit 5.

An address transition detection signal $\phi$ATD, which is a pulse signal generated by the transition of address signals $A_O$ to $A_n$, is output from the address buffer ATD circuit 4 and transmitted to a clock generator 6, where an equalizing pulse signal $\phi$EQ is generated on the basis of the pulse of the address transition detection signal $\phi$ATD. An output enable signal $\overline{OE}$ is also input from outside to the clock generator 6 so as to be supplied to the output circuit 5. The equalizing signal $\phi$EQ is generated in the basis of the pulse of the address transition detection signal $\phi$ATD. An output enable signal $\overline{OE}$ is also input from outside to the clock generator 6 so as to be supplied to the output circuit 5. The equalizing signal $\phi$EQ is also transmitted to the output circuit 5. Thus the data signal $D_{out}$, the equalizing signal $\phi$EQ and the signals $\phi\overline{OE}$ are transmitted to the output circuit 5, where the outputting and precharging operations are performed, as will be described subsequently.

The equalizing signal $\phi$EQ is transmitted to a bit line equalizing precharging control circuit 8, while being simultaneously transmitted a common data line equalizing and precharging control circuit 9. A signal WE which undergoes transition since the time of writing until reading is transmitted to a $\phi$EQW generator 7. A signal $\phi$EQW from the generator 7 is similarly transmitted to the bit line equalizing precharging control circuit 8 and to the common data line equalizing precharging control circuit 9. Thus the bit line equalizing precharging control circuit 8 and the common data line equalizing precharging control circuit 9 are controlled not only by the equalizing signal $\phi$EQ but by the signal $\phi$EQW.

Figure 3:
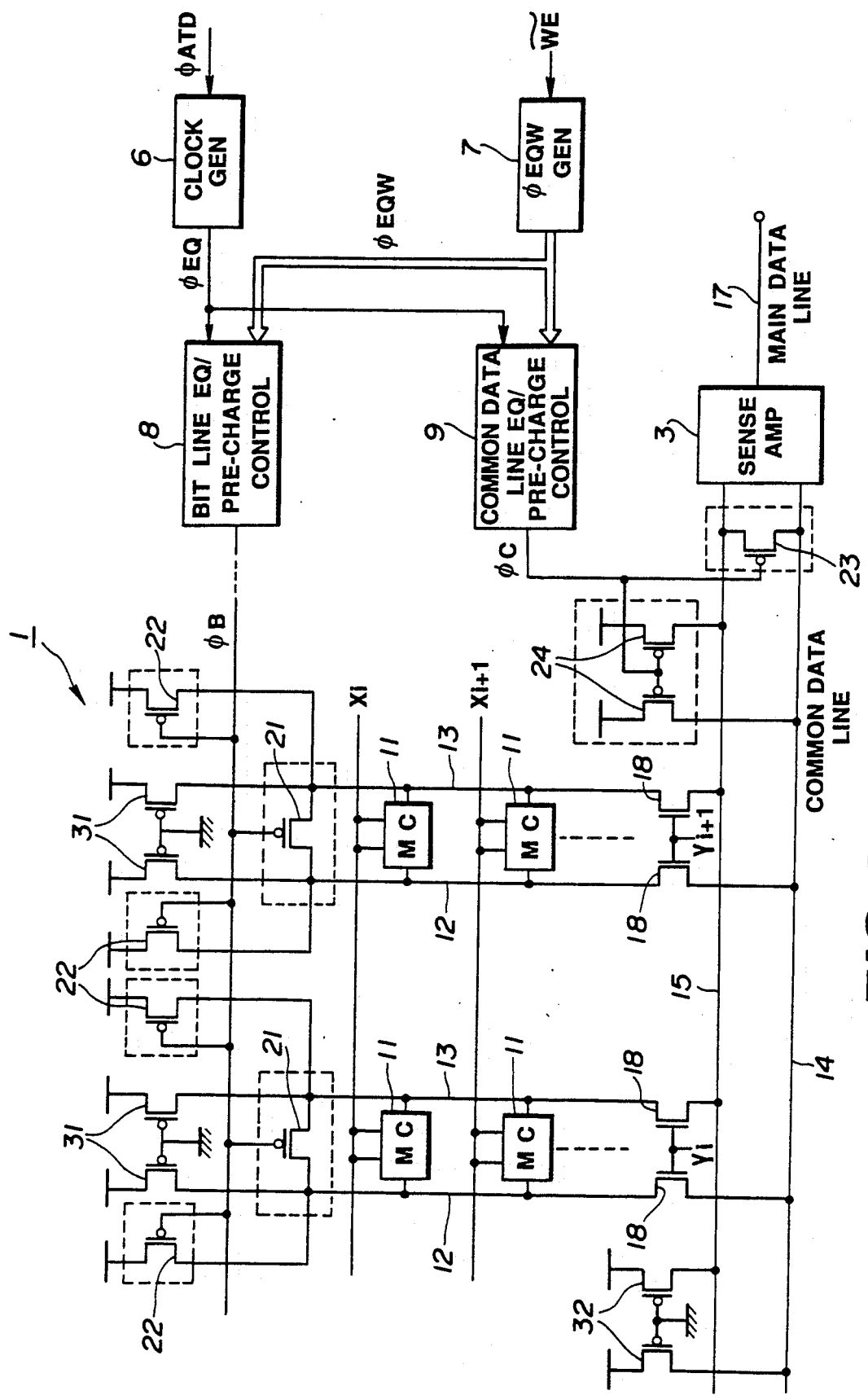
FIG. 3 is a circuit diagram showing essential parts of the device of FIG. 2.

The memory cell array 1 and the peripheral circuitry are shown in FIG. 3. A number of memory cells 11 are arrayed in a matrix configuration with each cell 11 being connected to a pair of bit lines 12, 13. A potential difference is produced across these bit lines 12, 13 at the time of reading and writing. Word lines $X_i$, $X_{i+1}$, ..., arranged at right angles with the bit lines 12, 13, are connected to the memory cells 11. By signals from a row decoder, the word lines $X_i$, $X_{i+1}$, ... are brought to a high level at the time of row selection to turn on word transistors, not shown, of the memory cells 11. To the bit lines 12, 13 is connected a source or a drain of a pMOS transistor 21. The pMOS transistor 21 constitutes a bit line equalizing circuit and can short-circuit the bit line pair 12, 13. To the gate of the pMOS transistor 21 is supplied a signal $\phi$B from the bit line equalizing precharging control circuit 8. Between the bit line pair 12, 13 and the high level source voltage is connected a pMOS transistor 22 constituting the bit line precharging circuit and having its source and drain connected to a source voltage and to the bit lines 12, 13, respectively. To the gate of the pMOS transistor 22 is supplied the signal $\phi$B from the bit line equalizing precharging control circuit 8, similarly to the pMOS transistor 21. A bit line load transistor 31 is provided for terminating the bit lines 12, 13. This bit line load transistor 31 has its source and gate connected to the source potential and to the ground potential GND, respectively. A pair of nMOS transistors 18, 18 functioning as a column select switch, are connected across the bit line 12, 13. The bit line 12 is connected via nMOS transistors 18 to a common data line 15 while the bit line 13 is connected to the common data line 15 via nMOS transistor 18. To the gates of the nMOS transistors 18, 18 associated with the bit line pair 12, 13 are connected common column select lines $X_i$, $Y_{i+1}$, ..., which are selectively brought to a high level by signals from a column decoder, not shown. The signals from the column decoder are based on the address signals and function to select a specified one of the memory cells 11 in association with the word lines $X_i$, $X_{i+1}$, ....

The common data line pair 14, 15 functions to select a specified number of bit line pairs in common to associated sense amplifiers 3. Each sense amplifier 3 is connected at the terminals of this common data lines 14, 15 for amplifying the signal potential differential across the common lines 14, 15. A main data line 17 is taken out from the sense amplifier 3 for input/output and is used for data outputting. A pair of pMOS transistors 32, 32 functioning as common data line load are connected across the common data lines 14, 15. The source or the drain of the pMOS transistor 23 are connected to the common data lines 14, 15. This pMOS transistor 23 constitutes the common data line equalizing circuit and can short-circuit the common data line pair 14, 15. To the gate of the pMOS transistor 23 is supplied a signal $\phi C$ from the common data line equalizing precharging control circuit 9. Between the common data line pair 14, 15 and the source voltage connected a pair of pMOS transistors 24, 24 constituting the common data line precharing circuit, with the source and the drain of each of the pMOS transistors 24, 24 being connected to the source potential and to the common data lines 14, 15 respectively. The signal $\phi C$ from the common data line equalizing precharging control circuit 9 is also transmitted to the gate of each of the pMOS transistors 24.

The circuit for actuating the equalizing circuit and the precharging circuit is hereinafter explained. The equalizing and the precharging operations for the bit lines 12, 13 are performed by the signal $\phi B$ from the bit line equalizing and precharge control circuit 8, while the equalizing and the precharing operations for the common data lines 14, 15 are performed by the signal $\phi C$ from the common data line equalizing precharge control circuit 9. In case of transition from writing to reading, the bit line equalizing and precharging control circuit 8 and the common data line equalizing and precharge control circuit 9 perform a control operation by the pulse signal $\phi EQW$ from the $\phi EQW$ generator 7. Thus, in case of transition from writing to reading, as later described, a high speed equalizing and precharging operation may be performed. In case of other address transitions, the control circuits 8, 9 perform necessary control operations by the pulse signal $\phi EQ$ generated by the clock generator 6 on the basis of the signal $\phi ATD$ from the address transition detection circuit, not shown.

Referring to FIGS. 4 and 5, the $\phi EQW$ generator 7 will be explained. As shown in FIG. 4, the $\phi EQW$ generator 7 generates the pulse signal $\phi EQW$ at the rising timing of the write enable signal WE. When the write enable signal WE is at the low level or at the high level, the chip is set to the write state or to the reading state, respectively. Hence, the rising of the signal WE corresponds to the transition from writing to reading and this timing of transition may be used to achieve high speed equalizing and precharging.

The circuit construction is briefly explained. Referring to FIG. 5, a pad 41 to which the signal WE is input is connected to an input terminal of a NOR circuit 42, having its other input terminal grounded, while the output of the NOR circuit 42 is input to a NAND circuit 44 by way of an inverter 43. The output of the inverter 43 is connected to the NAND circuit 44 by way of a delay circuit 45 consisting of plural stages of inverters. The delay circuit 45 determines the pulse width of the signal $\phi EQW$. The output of the NAND circuit 44 is transmitted as a pulse signal $\phi EQW$ to the bit line equalizing and precharging circuit 8 and to the common data line equalizing and precharging control circuit 9 by way of the inverter 46. In this manner, the $\phi EQW$ generator 7 directly generates pulses from the signal WE and collection of plural stages of address transitions is unnecessary so that the pulse signals $\phi EQW$ may be transmitted at elevated speeds to the control circuits 8, 9 to shorter the write recovery time.

By referring to FIGS. 6 and 3, the operation of the SRAM of the illustrative embodiment is explained. The address signal(a) is changed at time $t_0$, at the same time that the write enable signal WE(c) is changed from the low level to the high level. With the write enable signal thus changed, the chip is switched from the write operation to the reading operation.

This write enable signal is transmitted immediately to the $\phi EQW$ generator 7 shown in FIG. 3 and, at a time $t_1$ after lapse of an extremely short time, a pulse signal $\phi EWQ$ (d) is produced. It is because the pulse signal $\phi EQW$ is generated with high response from the write enable signal by the $\phi EQW$ generator 7. The pulse signal $\phi EQW$ thus produced is transmitted to the bit line equalizing precharge control circuit 8 and to the common data line equalizing and precharge control circuit 9. The bit line equalizing, bit line precharging, common data line equalizing and common data line precharging operations are performed by the control signals $\phi B$, $\phi C$ from the control circuit 8, 9. That is, at the bit lines 12, 13, the pMOS transistor 21 of the equalizing circuit is turned on, while the pMOS transistor 22 of the precharging circuit is turned on. The result is that the level(e) at the bit line pair, which has been swung almost fully, is raised towards the source voltage side when the current flows from the high level bit line to the low level bit line by equalizing, with the precharging pMOS transistor 22 turned on, until the potentials at the bit lines 12, 13 become equal to each other at time $t_2$. At the timing of time $t_2$ or at time $t_3$, the pulse signal $\phi EQW$ goes low to terminate the equalizing and precharging operation. Similarly, on the common data lines 14 and 15, the pMOS transistor 23 of the equalizing circuit is turned on and the pMOS transistor 24 of the precharging circuit is turned on. The result is that the level(f) at the common data line pair, which has been swung almost fully, is raised to the source voltage side by the pMOS transistor 24, with the current flowing from the high level common data line to the low level common data line by equalization, until the potentials at the common data lines 14, 15 become equal to each other at time $t_4$.

In this manner, the equalizing and precharging operations are performed at the bit lines 12, 13 and the common data lines 14, 15 on the basis of the signal $\phi EQW$ and, towards the close of these operations, the potential(b) of the word line to be selected is raised at time $t_5$ to effect the row selecting operation. By the word line selecting operation, the word transistors of the memory cells 11 of a given column are turned on to turn on the drive transistor to cause the signal potential difference to appear across bit lines 12, 13. Such signal potential difference is also caused to appear on the common data lines 14, 15 by way of the pMOS transistor 18 as the column selecting switch. The data are output and read out by way of the sense amplifiers 3.

For comparison, the operation by the pulse signal φEQ based on the address transition detection circuit is explained with reference to signals (g) to (i) shown by broken lines in FIG. 6. After the change in the address signal at time to and at the time of using the address transition detection circuit, a delay is caused and, at time $t_{11}$, a pulse signal φEQ(g) is generated by the clock generator 6. As a result, the equalizing and precharging operation for the level h on the bit line and the level(i) on the common data line is performed with a delay as compared to the case of the φEQW pulse signals. At time $t_{12}$ the levels of the bit line pair become equal, and at time $t_{13}$ the levels of the common data line pair become equal. With the time difference of approximately ΔT at the bit lines as compared to the case of the pulse signal φEQW, it is seen that a higher speed may be realized when the equalizing and precharging operation is carried out by generating the φEQW pulses by the φEQW pulse generator 7 on the basis of the write enable signal WE.

With the SRAM of the present embodiment, the φEQW pulse is generated at an elevated speed by the φEQW pulse generator 7 from the write enable signal WE, at the time of transition from the write operation to the readout operation, despite the fully swung state of the bit line and the common data line, to perform the equalizing and precharging operation, so that high speed access time can be realized, while the word line can be selected at a high speed to prevent data destruction in the memory cell.

Although the bit line and the common data line are equalized and precharged in the above embodiment, only the bit line can be equalized and/or precharged and/or only the common data line can be equalized and/or precharged. Although the precharging and equalizing circuits are each formed by pMOS transistors, other transistor types may also be used in combination. Similarly, for preparing the impedance, the threshold voltage Vth, the signal level supplied to the base or the gate, or the element size can be prepared. The bit line load or the common data line load can be formed as the variable load means.

An output circuit 5 used as an output buffer of the SRAM of the present illustrative embodiment is explained.

Figure 7:
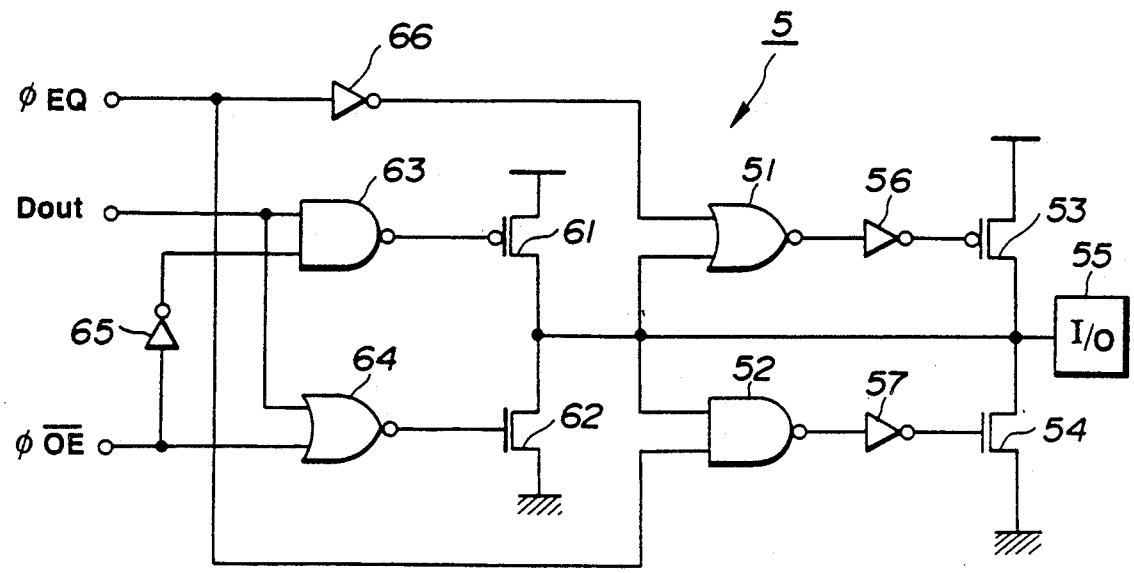
FIG. 7 is a circuit diagram showing an example of an output circuit in the semiconductor memory device of FIG. 2.

The circuit construction of the output circuit 5 is shown in FIG. 7. The portion functioning as the buffer per se is constituted by a NAND circuit 63, a NOR circuit 64, a pMOS transistor 61 and a nMOS transistor 62. The data signal $D_{out}$ is supplied to one input terminal of a 2-input NOR circuit 64, while the signal φOE is supplied to its other input terminal. The signal φOE is supplied to one input terminal of a 2-input NAND circuit 63 by way of an inverter circuit 65, while the data signal $D_{out}$ is supplied to its other terminal. The output terminal of the NAND circuit 63 is connected to the gate of the pMOS transistor 61. The output terminal of the NOR circuit 64 is connected to the gate of the nMOS transistor 62. The pMOS transistor 61 and the nMOS transistor 62 are connected in series between the source voltage and the ground voltage. The pMOS transistor 61 has its source connected to the source voltage while the nMOS transistor 62 has its source connected to the ground voltage. The junction point between the pMOS transistor 61 and the nMOS transistor 62 proves to be the output 55.

A circuit is provided for performing the precharging operation besides the function as the buffer. A 2-input NOR circuit 51 and a 2-input NAND circuit 52 function as level detection means. The one input terminal of the NOR circuit 51 is supplied with the equalizing signal φE,ovs/EQ/ by way of the inverter circuit 66. The one input terminal of the NAND circuit 52 is directly supplied with the equalizing signal φEQ. The remaining input terminals of the NOR circuit 51 and the NAND circuit 52 are connected to the output 55 for level detection. The output terminal of the NOR circuit 51 is connected via inverter circuit 56 to the gate of the pMOS transistor 53 constituting the precharging circuit. The output terminal of the NAND circuit 52 is connected via inverter circuit 57 to the gate of the nMOS transistor 54 similarly constituting a precharging circuit. The source of the pMOS transistor 53 is supplied with the source voltage, while its drain is connected to the output 55. The source of the nMOS transistor 54 is supplied with the ground voltage while its drain is connected to the output 55.

Figure 8A:
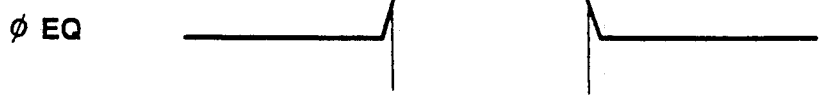
FIG. 8 is a timing chart for illustrating the operation of the output circuit shown in FIG. 7.
Figure 8B:
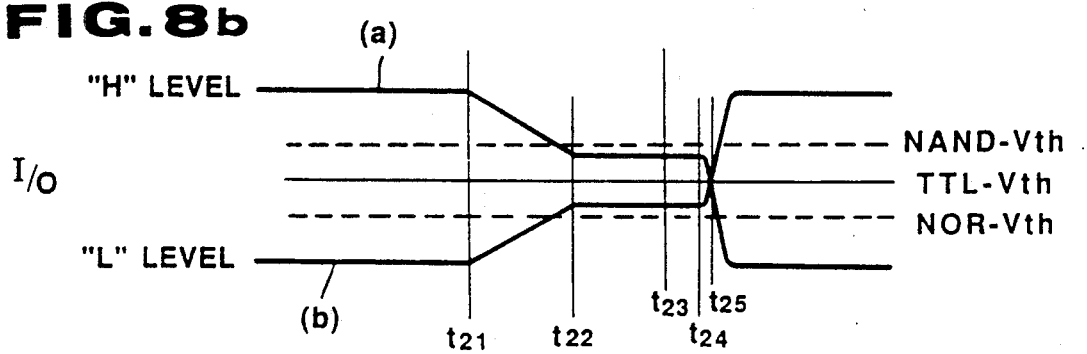

Referring to FIG. 8, the operation is explained.

It is assumed that, before application of the pulse of the equalizing signal φEQ, the signal level at the output 55, as the data of the preceding access as at waveform(a), is at the high level. At the next access, the pulse of the equalizing signal φEQ is generated at time $t_{21}$, the signal level of the equalizing signal φEQ being at the high level. Thus the high level signal is supplied to one input terminal of the NAND circuit 52, while the low level signal is supplied to the one input terminal of the NOR circuit 51 by way of the inverter circuit 66. Since the voltage at the output 55 is at the high level, the output of the NOR circuit 51 on detecting the high level at the output 55 is at the low level, while the gate voltage of the pMOS transistor 53, transmitted by way of the inverter circuit 56, is at the high level. Thus the pMOS transistor 53 is turned off. The output of the NAND circuit 52 on detecting the high level at the output 55 is at the low level, while the gate voltage of the nMOS transistor 54, supplied by way of the inverter circuit 57, is at the high level. thus the nMOS transistor 54 is turned on. Hence, since time $t_{21}$, the pMOS transistor 53 is turned off, while the nMOS transistor 54 is turned on, with the potential at the output 55 being pulled towards the ground voltage side. Since the pMOS transistor 53 is off, there is no through-current through the precharging circuit.

When the precharging is continued and the level at the output 55 is lowered, the level of the output 55 falling to a level lower than the threshold voltage of the NAND circuit 52 detecting the level, the output of the NAND circuit 52 goes to a high level at time $t_{22}$. As a result, the gate voltage at the nMOS transistor 54 falls to a low level and the nMOS transistor 54 is turned off to terminate the precharging operation. With the termination of the precharging operation, the voltage level at the output 55 is maintained at the level near the threshold voltage of the NAND circuit 52, so that high speed transition may be realized when swinging from the level to the high or low level.

At time $t_{23}$, the equalizing signal $\phi EQ$ falls to a low level. Since then and until the next $\phi EQ$ pulse is supplied, the output of the NAND circuit 52 and the output of the NOR circuit 51 are maintained at the high and low levels, respectively. As a result, the precharging circuit, formed by the pMOS transistor 53 and the nMOS transistor 54 is not in operation. When the falling of the equalizing pulse is faster than the time $t_{22}$, the level at the output 5 remains at the level of the falling of the equalizing pulse Data are then output by the inputting of the data signal $D_{out}$ and at the timing of the signal $\overline{\phi OE}$. If the input data signal $D_{out}$ is at the low level, the output of the NAND circuit 63 is at the high level, the output of the NOR circuit 64 is at the high level, the pMOS transistor 61 is turned off and the nMOS transistor 62 is turned on. As a result, the level of the waveform(a) at time $t_{24}$ is lowered gradually, by the driving of the nMOS transistor 62, from the level exceeding the threshold voltage of the NAND circuit 52, until the level at the output 55 is changed to the low level at time $t_{25}$ beyond the threshold voltage of TTL.

If the data of the preceding cycle is at the low level, the level at the output 55 is initially at the low level, as shown at the waveform(b). Then, at time $t_{21}$, the pulse of the equalizing signal $\phi EQ$ is supplied, the output of the NOR circuit 51 going to the high level and the output of the NAND circuit 52 going to the low level. The output of the inverter circuit 56 goes to the low level and the output of the inverter circuit 57 goes to the high level, with the pMOS transistor 53 and the nMOS transistors 54 being turned on and off, respectively. Thus the level of the output 55 is raised by the pMOS transistor 53, by way of the precharging operation.

The level at the output 55 exceeds at time $t_{22}$ the threshold voltage of the NOR circuit 51. The output of the NOR circuit 51 is changed from the high level to the low level to turn off the pMOS transistor 53 by means of the inverter circuit 56 to terminate the precharging operation. Then, supposing that after falling at time $t_{23}$ of the equalizing signal $\phi EQ$, the high level input is applied as the data signal $D_{out}$, the output of the NAND circuit 63 goes to the low level to turn on the pMOS transistor 61, so that the level of the output 55 is raised at time $t_{24}$, as shown at waveform(b), to exceed the TTL threshold voltage at time $t_{25}$.

Figure 10A:
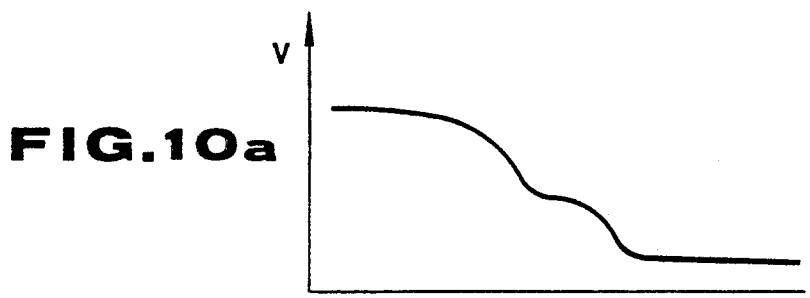
FIG. 10 is a waveform diagram for the voltage and the current during readout of a example of the output circuit in the semiconductor memory device according to the invention.
Figure 10B:
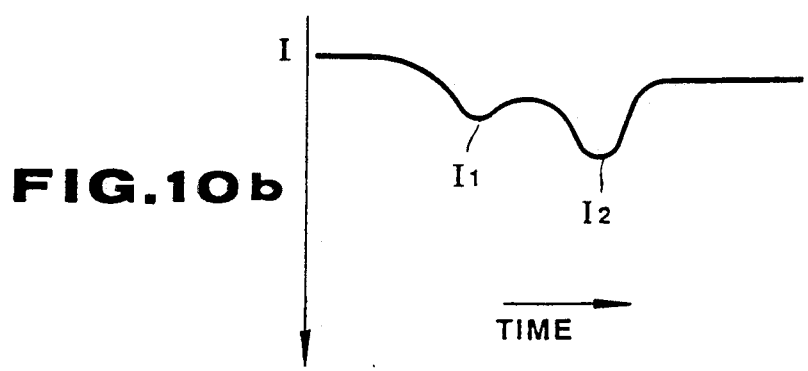

With the output circuit of the SRAM of the present illustrative embodiment, the NOR circuit 51 and the NAND circuit 52 operate in response to the level of the output 55 so that precharging occurs towards the reverse logic level potential. Above all, one of the pMOS transistor 53 and the nMOS transistor 54 constituting the precharging circuit is turned on by the NOR circuit 51 and the NAND circuit 52 as the level detection means to suppress the through-current. FIG. 10 shows changes in the voltage and the current when employing the output circuit of the present SRAM. Assuming that the voltage V is changed during readout from the high level to the low level, the current I flows by the precharging operation as it is divided into smaller peaks $I_1$ and $I_2$ so that the current peak about one fifth that of the conventional device suffices.

In other words, the function of the output circuit 5 to suppress the through-current is exhibited by the fact that the NAND circuit 52 and the NOR circuit 51, both functioning as the level sensor means, have different threshold voltages, when the output level is between the threshold voltages, and that both the pMOS transistor 53 and the nMOS transistor 54 are turned off. It is possible to set the threshold voltages of the NAND circuit 52, the TTL circuit and the NOR circuit 51 to about 2 V, 1.5 V and 1.0 V respectively. The difference between the threshold voltages of the level sensor and the output signal is preferably set with an allowance such that the threshold voltage of the output signal is not exceeded upon termination of precharging.

Although the center of the output signal level is determined with the TTL threshold voltage as the reference, precharging can be made to any desired level between the source voltage and the ground voltage. The output circuit is not limited to the output buffer, but may be used in a buffer for data transfer in the memory device. Thus it may be utilized for a circuit portion where the large wiring capacitance is afforded and high speed can be realized by precharging. In addition, although the circuit is provided in the above illustrative embodiment for precharging to both high and low levels, precharging may be made only to one of the high or low sides. For example, the NAND circuit 52, the inverter circuit 57 and the nMOS transistors may be eliminated, or alternatively, the NOR circuit 51, the inverter circuit 56 and the pMOS transistor 53 may be eliminated.

Figure 9:
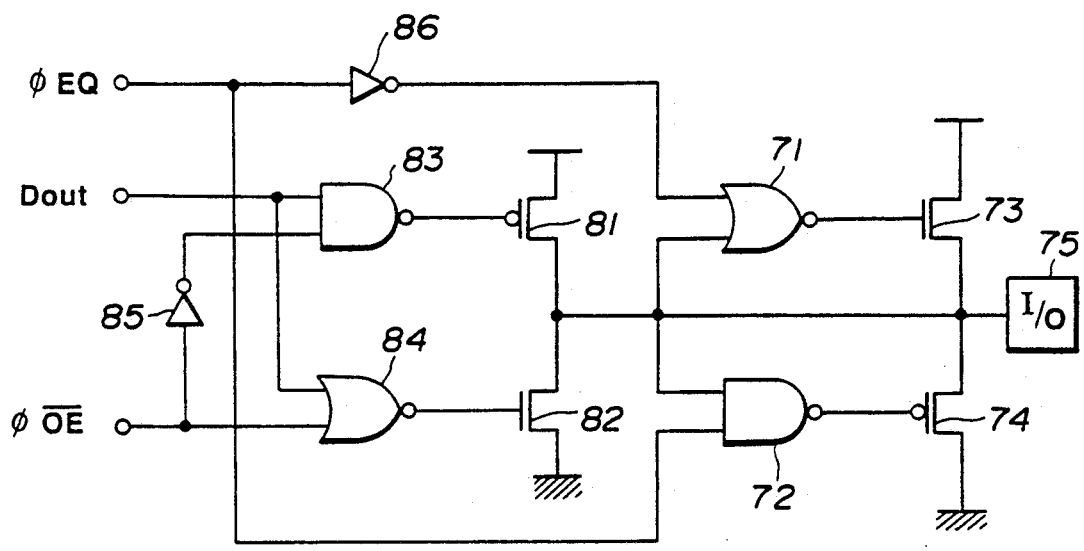
FIG. 9 is a circuit diagram showing another example of the output circuit in the semiconductor memory device of FIG. 2.

FIG. 9 shows a modification of the output circuit 5. The portions of the output circuit functioning as the buffer per se are a NAND circuit 83, a NOR circuit 84, a pMOS transistor 81 and a nMOS transistor 82. These portions are the same as those of the above mentioned output circuit. Thus the data signal $D_{out}$ is supplied to one input terminal of the 2-input NOR circuit 84, while a signal $\overline{\phi OE}$ is supplied to its other input terminal. A signal $\overline{\phi OE}$ is supplied to one input terminal of the 2-input NAND circuit 83 by way of an inverter circuit 85, while the data signal $D_{out}$ is supplied to its other input terminal. The output terminal of the NAND circuit 83 is connected to the gate of the pMOS transistor 81. The output terminal of the NOR circuit 84 is connected to the gate of the nMOS transistor 82. The pMOS transistor 81 and the nMOS transistor 82 are connected in series between the source voltage and the ground voltage. The source of the pMOS transistor 81 is connected to the source voltage while the source of the nMOS transistor 82 is connected to the ground potential. The junction point of the drains of the pMOS transistor 81 and the nMOS transistor 82 acts as an output 75.

The circuit taking charge of precharging is composed of a 2-input NOR circuit 71, a 2-input NAND circuit 72, a nMOS transistor 73 and a pMOS transistor 74. The 2-input NOR circuit 71 and the 2-input NOR circuit 72 function as level detection means. The one input of the NOR circuit 71 is supplied with the equalizing signal $\phi EQ$ by way of an inverter circuit 86. The one input of the NAND circuit 72 is directly fed with the equalizing signal $\phi EQ$. The remaining input terminals of the NOR circuit 71 and the NAND circuit 72 are connected for level detection to the output 75. The output terminal of the NOR circuit 71 is connected to the gate of the nMOS transistor 73 constituting a precharging circuit. The output terminal of the NAND circuit 72 is connected to the gate of the pMOS transistor 74 constituting a precharging circuit. The drain of the nMOS transistor 73 fed with a source voltage while its source is connected to the output 75. The drain of the pMOS transistor 74 is supplied with the ground potential, while its source is connected to the output 75.

With the output circuit of the present modified embodiment, the precharging operation is started by the equalizing signal φEQ supplied to the NOR circuit 71 and the NAND circuit 72. The level of the output 75 can be brought to close to the TTL level under suppression of the through-current. The present modification differs from the preceding embodiment in that the inverter circuit between the precharging circuit and the level sensor is eliminated and in that the sources of the nMOS transistor 73 and the pMOS transistor 74 are connected to the output 75. Thus the voltage level rise or fall when the output 75 is precharged may be stopped up to an amount corresponding to the threshold voltage of the pMOS transistor 74 or nMOS transistor 73. In addition, the space may be reduced by an amount corresponding to the inverter circuit connected to the gate of the MOS transistor.

We claim:

1. A memory device comprising
a semiconductor substrate having a major surface,
a plurality of memory cells arranged on said major surface in a matrix configuration and composed of flipflop circuits for data storage,
a plurality of pairs of bit lines formed on said major surface and coupled to each column of said memory cells for handling complementary read-out data or write data,
a plurality of word lines formed on said major surface and provided for each row of said memory cells for selecting the rows of said memory cells
a sense amplifier arranged on said major surface between each pair of bit lines for amplifying the voltage across each pair of said bit lines,
equalizing means formed on said major surface and operating transiently prior to selection of said memory cell by said word line for equalizing an associated pair of said bit lines,
equalizing control means formed on said major surface for setting the operating time interval of said equalizing means,
signal generating means formed on said major surface and responsive to address signals supplied for selection of said bit lines and said word lines to generate a signal actuating said equalizing control means, and
second signal generating means formed on said major surface and adapted for detecting the transition from the writing to readout to actuate said equalizing control means at the time said transition is detected.

2. A memory device comprising
a semiconductor substrate having a major surface,
a plurality of memory cells arranged on said major surface in a matrix configuration and composed of flipflop circuits for data storage,
a plurality of pairs of bit lines formed on said major surface and coupled to each column of said memory cells for handling complementary read-out data or write data,
a plurality of word lines formed on said major surface for each row of said memory cells for selecting the rows of said memory cells,
a plurality of pairs of common data lines formed on said major surface and connected in common to a specified number of bit line pairs for handling complementary readout data or writing data,
a sense amplifier connected on said major surface between each pair of common data lines for amplifying the voltage across each pair of the common data lines,
equalizing formed on said major surface and operating transiently prior to memory cell selection by said word line for equalizing a pair of the common data lines
equalizing control means formed on said major surface for setting the operating time interval for the equalizing means,
signal generating means formed on said major surface and responsive to an address signal supplied for selection of the word lines and the bit lines to generate a signal for actuating said equalizing control means, and
second signal generating means formed on said major surface and adapted for detecting the transition from writing to readout and actuating said said equalizing control means at the time said transition is detected.

3. The memory device according to claim 2 further comprising
bit line equalizing means formed on said major surface and operating transiently prior to memory cell selection by said word line for equalizing a pair of the bit lines,
wherein said equalizing control means control said bit line equalizing means and said common data line equalizing means.

4. A memory device comprising
a semiconductor substrate having a major surface,
a plurality of memory cells arranged on said major surface in a matrix configuration and composed of flipflop circuits for data storage,
a plurality of pairs of bit lines formed on said major surface and coupled to each column of said memory cells for handling complementary read-out data or write data,
precharging means formed on said major surface and operating transiently prior to memory cell selection by said word line to precharge each bit line to prevent destruction of data in each memory cell,
a plurality of word lines formed on said major surface and provided for each row of said memory cells for selecting the rows of said memory cells,
a sense amplifier connected on said major surface between each pair of bit lines and adapted for amplifying the voltage across each pair of the bit lines,
precharging control means formed on said major surface for contolling the operating time interval for said precharging means,
signal generating means formed on said major surface and responsive to address signals supplied for selection of said bit lines to generate a signal actuating said precharging control means, and
second signal generating means formed on said major surface and adapted for detecting the transition from the writing to readout to actuate said precharging control means at the time said transition is selected.

5. A memory device comprising
a semiconductor substrate having a major surface,
a plurality of memory cells arranged on said major surface in a matrix configuration and composed of flipflop circuits for data storage,
a plurality of pairs of bit lines formed on said major surface and coupled to each column of said memory cells for handling complementary read-out data or write data, a plurality of word lines formed on the major surface and provided for each row of each said memory cell for selecting the rows of said memory cells, a plurality of pairs of common data lines formed on said major surface and connected in common to a specified number of pairs of bit lines for handling complementary readout data or writing data, a sense amplifier connected to each pair of common data lines on said major surface and adapted for amplifying the voltage across each pair of the common data lines, precharging means formed on said major surface and operating transiently prior to selection of said memory cell by said word line for precharging an associated pair of said common data, precharging control means formed on said major surface for setting the operating time interval of said precharging means, signal generating means formed on said major surface and responsive to address signals supplied for selection of said bit lines to generate a signal actuating said precharging control means, and second signal generating means formed on said major surface and adapted for detecting the transition from the writing to readout to actuate said precharging control means at the time said transition is detected.

6. The memory device according to claim 5 further comprising
bit line precharging means formed on said major surface and operating transiently prior to memory cell selection by said word line for precharging a pair of the bit lines,
wherein said precharging control means control said bit line precharging means and said common data line precharging means.

7. The memory device according to any one of the claims 1 to 6 wherein transition from writing to readout is detected on the basis of a write enable signal.

8. The memory device according to claim 4 comprising
equalizing means formed on said major surface and operating transiently prior to memory cell selection by said word line for equalizing a pair of bit lines and
equalizing control means formed on said major surface for setting the operating time interval of said equalizing lines,
both said equalizing control means and said precharging control means being controlled by the signal from each of said signal generating means.

9. The memory device according to claim 5 further comprising
equalizing means formed on said major surface and operating transiently prior to memory cell selection by said word line for equalizing a pair of the common data lines, and
equalizing control means formed on said major surface for setting the operating time interval for said equalizing means,
both said equalizing control means and the precharging control means being controlled by the signal from each of said signal generating means.

10. The memory device according to claim 6 further comprising,
equalizing means operating transiently prior to memory cell selection by said word line for equalizing each of a pair of common data lines
equalizing means operating transiently prior to selection of said memory cell by said word line for equalizing each of a pair of bit lines, and
equalizing control means formed on said major surface for controlling each of said equalizing means,
both of said equalizing control means and the precharging control means being controlled by the signal from each of said signal generating means.

11. A memory device comprising
a semiconductor substrate having a major surface,
a plurality of memory cells arranged on said major surface in a matrix configuration for data storage,
a plurality of pairs of bit lines formed on said major surface and coupled to each column of said memory cells for handling complementary read-out data or write data,
a plurality of word lines formed on said major surface and provided for each row of said memory cells for selecting the rows of said memory cells for,
a sense amplifier arranged on said major surface between each pair of bit lines for amplifying the voltage across each pair of said bit lines, and
an output circuit for amplifying the signal from said sense amplifier,
said output circuit including
an output terminal for outputting amplified output signals from said sense amplifier
output means for driving said output terminal to a first or a second level,
level detecting means for detecting the level at said output terminal, and
precharging means responsive to a signal from said level detection means to precharge the level at said output terminal to a third level between the first level and the second level.

12. The memory device according to claim 11 wherein
said level detection means operate transient by an equalizing signal generated in response to address transition.

13. The memory device according to claim 11 wherein
said precharging means include a MOS transistor having the drain connected at least to said output terminal and having its gate connected to an output terminal of said level detecting means.

14. The memory device according to claim 11 wherein
said precharging means is a MOS transistor having its source connected at least to said output terminal and having its gate connected to the output terminal of said level detecting means.

15. The memory device according to claim 11 wherein said third level is the output deciding level.

16. The memory device according to claim 11 wherein the first level is the source voltage, the second level is the ground voltage and the third level to the output deciding level of a TTL compatible.

* * * * *